United States Patent
Katayama et al.

(10) Patent No.: US 8,289,087 B2
(45) Date of Patent: Oct. 16, 2012

(54) METHOD FOR DETECTING AND CORRECTING PHASE SHIFT BETWEEN I DATA CLOCK IN Q DATA CLOCK IN QUADRATURE MODULATOR OR QUADRATURE DEMODULATOR

(75) Inventors: Yasunao Katayama, Kanagawa-ken (JP); Yasuteru Kohda, Kanagawa-ken (JP); Nobuyuki Ohba, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 12/882,283

(22) Filed: Sep. 15, 2010

(65) Prior Publication Data

US 2011/0063150 A1  Mar. 17, 2011

(30) Foreign Application Priority Data

Sep. 16, 2009  (JP) .................................. 2009-214679

(51) Int. Cl.
*H03L 7/00* (2006.01)

(52) U.S. Cl. .................... 331/25; 331/DIG. 2; 341/122; 455/67.16; 327/3; 327/8; 327/40; 327/47; 327/48; 327/151; 327/160

(58) Field of Classification Search .................. 341/122; 455/67.16; 331/25, DIG. 2; 327/3, 8, 40, 327/47, 48, 151, 160
See application file for complete search history.

(56) References Cited

U.S. PATENT DOCUMENTS

| 5,400,366 | A  | * | 3/1995  | Iwamatsu  | 375/344 |
|---|---|---|---|---|---|
| 6,825,702 | B2 | * | 11/2004 | Montagnana | 327/156 |
| 2006/0045216 | A1 | * | 3/2006  | Hegyi et al. | 375/344 |
| 2009/0289672 | A1 | * | 11/2009 | Hua et al. | 327/147 |

FOREIGN PATENT DOCUMENTS

| JP | 05-010992 A | 1/1993 |
|---|---|---|
| JP | 07-202965 A | 8/1995 |

(Continued)

OTHER PUBLICATIONS

Shergill, "A 6Gs/s, 8-bit Data Acquisition Channel Using National Ultra-High-Speed ADCs," National Semiconductor, Application Note, 2008, pp. 1-27.

(Continued)

*Primary Examiner* — Arnold Kinkead
*Assistant Examiner* — Richard Tan
(74) *Attorney, Agent, or Firm* — Vazken Alexanian

(57) ABSTRACT

A computer-implemented method, device, and program product for detecting a phase shift between an I data clock and a Q data clock in processing an I data signal or a Q data signal used in quadrature modulation or quadrature demodulation. The method includes: receiving an input of the I data clock and the Q data clock; performing exclusive-ORing (XORing) on the I data clock and the Q data clock; latching a result of the performance of XORing on a phase sampling clock which is asynchronous with the I data clock and the Q data clock; incrementing a first number; incrementing a second number; comparing the incremented first number and the incremented second number and determining, based on a phase determination criterion, a phase shift between the I data clock and the Q data clock; and detecting a phase shift between the I data clock and the Q data clock.

6 Claims, 8 Drawing Sheets

FOREIGN PATENT DOCUMENTS

JP    2000-077990 A    3/2000

OTHER PUBLICATIONS

Maxim, "12-Bit 4.0Gsps High-Dynamic Performance Wideband DAC," Data Sheet, 2008, pp. 1-23.

Maxim, "Synchronizing Multiple High-Speed Multiplexed DACs for Transmit Applications," Application Note, 2006, pp. 1-6.

Texas Instruments, "Digital Phase-Locked Loop Design Using SN54/74LS297," Application Note, SDLA005B, Mar. 1997, pp. 1-15.

* cited by examiner

CASE 1
I DATA CLOCK
Q DATA CLOCK
XOR OUTPUT

CASE 2
I DATA CLOCK
Q DATA CLOCK
XOR OUTPUT

CASE 3
I DATA CLOCK
Q DATA CLOCK
XOR OUTPUT

CASE 4
I DATA CLOCK
Q DATA CLOCK
XOR OUTPUT

METHOD FOR DETECTING AND CORRECTING PHASE SHIFT BETWEEN I DATA CLOCK IN Q DATA CLOCK IN QUADRATURE MODULATOR OR QUADRATURE DEMODULATOR

CROSS-REFERENCE TO RELATED APPLICATIONS

This application claims priority under 35 U.S.C. §119 to Japanese Patent Application No. 2009-214679 filed Sep. 16, 2009, the entire contents of which are incorporated by reference herein.

BACKGROUND OF THE INVENTION

1. Field of the Invention

The present invention relates to quadrature modulation and demodulation in high-speed wireless communications, and particularly to detection of a phase shift between an I data clock and a Q data clock in Digital-Analog Converters (DACs) or Analog-Digital Converters (ADCs) used in a modulator or demodulator and correction of the phase shift.

2. Description of the Related Art

Modulation is an operational scheme where during the transmission of information, the information is converted into appropriate electric signals according to the information type and the transmission medium. Demodulation is the restoration of an original signal wave from the modulated signal upon receipt of the transmitted modulated signal. In information transmission in wireless communications, the transmitter side modulates data to be transmitted and outputs the modulated data, and the receiver side receives and demodulates the data transmitted as radio waves.

A quadrature modulator converts data to be transmitted into I and Q signals by using a conversion table, and inputs the I and Q signals into an I-DAC (DAC: digital-to-analog converter) and a Q-DAC, respectively. An analog modulated signal I outputted from the I-DAC is multiplied by a carrier wave, and an analog modulated signal Q outputted from the Q-DAC is multiplied by a carrier wave which is out of phase by 90° with the carrier wave for the analog modulated signal I. The I and Q signals are then combined and outputted as a modulated signal. The technical definition of quadrature is to generate signals having no correlation with each other by multiplying two signals that are obtained by dividing an original signal by a sine wave and a cosine wave, respectively, and to add these two signals together and send the signal thus combined.

The analog modulated signal I outputted from the I-DAC and the analog modulated signal Q outputted from the Q-DAC have to be in exact synchronization with each other. To achieve the synchronization, an I data clock generated by the I-DAC and a Q data clock generated by the Q-DAC must be in phase with each other based on a sampling clock inputted to the I-DAC and the Q-DAC.

In Non-patent Literature 1 (Shergill, "A 6 Gs/s, 8-bit Data Acquisition Channel Using National Ultra-High-Speed ADCs," National Semiconductor, Application Note, 2008, pp. 1-27), the I-DAC and the Q-DAC are reset simultaneously so that the data clock from the I-DAC and the data clock from the Q-DAC can be in phase. However, this is not easy because they have to be reset in synchronization with a high-frequency sampling clock. Thus, a determination has to be made as to whether the reset has successfully brought the data clocks into the same phase.

In Non-patent Literature 2 (Maxim, "12-Bit 4.0 Gsps High-Dynamic Performance Wideband DAC," Data Sheet, 2008, pp. 1-23), since the DACs do not have a reset input function, the data transmitter side has to change the order of data transmission upon detecting the phase shift between the data clocks.

In Non-patent Literature 3 (Maxim, "Synchronizing Multiple High-Speed Multiplexed DACs for Transmit Applications," Application Note, 2006, pp. 1-6), clock swallowing is employed, which momentarily stops the sampling clock inputted to the I-DAC when the value obtained by performing XORing (exclusive ORing) on the data clock from the I-DAC and the data clock from the Q-DAC is 1. However, since the digital logic is inserted directly into the sampling clock circuit, the sampling clocks reaching the I-DAC and the Q-DAC tend to have skew. Further, the logic (active device) increases jitter.

Non-patent Literature 3 introduces a method of phase alignment by giving a data clock feedback to a PLL (phase-locked loop) that generates the sampling clock. However, a voltage controlled oscillator (VCO) used in the PLL degrades frequency stability. Moreover, since the I-DAC and Q-DAC use independent PLLs, the frequency shift and skew can be large. Non-patent Literature 3 also introduces a method of using a phase shifting function of a digital clock manager (DCM) of Xilinx FPGA to compare the data clocks while gradually delaying one of the data clocks. However, the maximum phase-controllable frequency of the DCM is 400 MHz even with the highest speed grade of the latest Virtex-5, and therefore a usable frequency is limited.

Non-patent Literature 4 (Texas Instruments, "Digital Phase-Locked Loop Design Using SN54/74LS297," Application Note, SDLA005B, March 1997, pp. 1-15), introduces a phase comparator used in a digital phase-locked loop (DPLL). The phase comparator performs M-time oversampling of the XOR output. M is one of the conditions for the DPLL to be locked, and has to be larger than 1 and as large as possible (sampling frequency must be larger than the clock).

SUMMARY OF THE INVENTION

According to an aspect of the present invention, a computer-implemented method is provided for detecting a phase shift between an I data clock and a Q data clock in processing an I data signal or a Q data signal used in quadrature modulation or quadrature demodulation, where the I data clock and the Q data clock are obtained based on a sampling clock. The method includes: receiving an input of the I data clock and the Q data clock; performing exclusive-ORing (XORing) on the I data clock and the Q data clock; latching a result of the performance of XORing on a phase sampling clock which is asynchronous with the I data clock and the Q data clock to create a sampled result; incrementing a first number when the sampled result having a value of 0 occurs in a predetermined period of time; incrementing a second number when the sampled result having a value of 1 occurs in the predetermined period of time; comparing the incremented first number and the incremented second number and determining, based on a phase determination criterion, a phase shift between the I data clock and the Q data clock; and detecting a phase shift between the I data clock and the Q data clock according to the determination based on the phase determination criterion.

According to another aspect of the present invention, a computer-implemented device is provided for comparing phases of an I data clock and a Q data clock in processing an I data signal or a Q data signal used in quadrature modulation or quadrature demodulation. The device includes: an XOR circuit that (i) receives an input of the I data clock and the Q data clock and (ii) performs exclusive-ORing (XORing) on the I data clock and the Q data clock; a latch circuit that latches a result of the performance of XORing on a phase sampling clock which is asynchronous with the I data clock and the Q data clock to create a sampled result; a first counter circuit that increments a first number when the sampled result having a value of 0 occurs in a predetermined period of time; a second counter circuit that increments a second number when the sampled result having a value of 1 occurs in the predetermined period of time; and a phase determiner that compares the incremented first number and the incremented second number to determine, based on a phase determination criterion, a phase shift between the I data clock and the Q data clock.

According to yet another aspect of the present invention, a computer-implemented device is provided for comparing phases of an I data clock and a Q data clock in processing an I data signal or a Q data signal used in quadrature modulation or quadrature demodulation. The device includes: a plurality of latch circuits that (i) receive an input of the I data clock and the Q data clock and (ii) perform latching on a phase sampling clock which is asynchronous with the I data clock and the Q data clock; an XOR circuit that performs exclusive-ORing (XORing) on the I data clock and the Q data clock to create a sampled result; a first counter circuit that increments a first number when the sampled result having a value of 0 occurs in a predetermined period of time; a second counter circuit that increments a second number when the sampled result having a value of 1 occurs in the predetermined period of time; and a phase determiner that compares the incremented first number and the incremented second number to determine, based on a phase determination criterion, a phase shift between the I data clock and the Q data clock.

According to still another aspect of the present invention, an article of manufacture tangibly embodying computer readable instructions which when implemented, causes a computer to carry out the steps of the method.

DETAILED DESCRIPTION OF THE PREFERRED EMBODIMENTS

It will be readily understood that the components of the present invention, as generally described and illustrated in the figures herein, may be arranged and designed in a wide variety of different configurations in addition to the described presently preferred embodiments. Thus, the following detailed description of the embodiments of the present invention, as represented in the figures, is not intended to limit the scope of the invention, as claimed, but is merely representative of selected presently preferred embodiments of the invention. The following description is intended only by way of example, and simply illustrates certain selected presently preferred embodiments of the invention as claimed herein.

According to embodiments of the present invention, there is no need to modify or observe a high-speed sampling clock, a high-speed data clock (of higher than 500 MHz) can be supported, an FPGA external logic is unnecessary which allows for an implementation with only an FPGA, and a phase sampling clock can have a lower frequency than a data clock.

Figure 1:
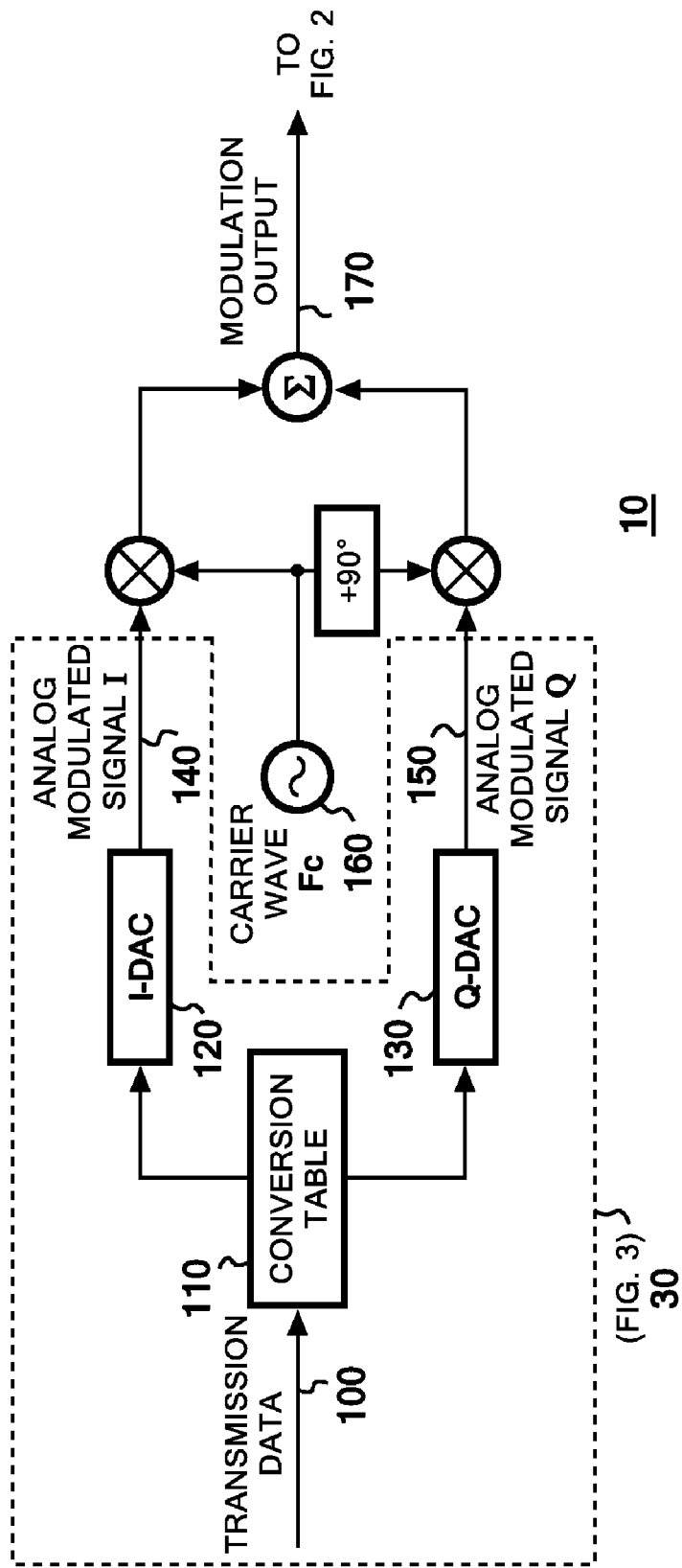
FIG. 1 is a diagram showing a general configuration of a quadrature modulator.

Referring to FIG. 1, a diagram shows a general configuration of a quadrature modulator. Data to be transmitted is outputted to a quadrature demodulator as a modulation output.

Figure 2:
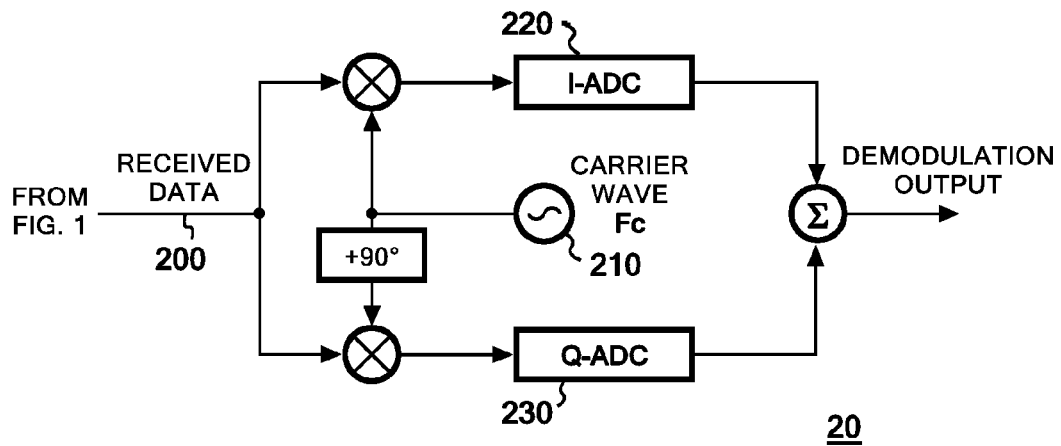
FIG. 2 is a diagram showing a general configuration of a quadrature demodulator.

Referring to FIG. 2, a diagram shows a general configuration of a quadrature modulator. As an input, the quadrature demodulator receives the modulation output transmitted as radio waves from the quadrature modulator of FIG. 1, and demodulates data thus received.

Referring again to FIG. 1, a quadrature modulator 10 converts transmission data 100 into I signals and Q signals by using a conversion table 110, and inputs the I signals and the Q signals into an I-DAC 120 and a Q-DAC 130, respectively. An analog modulated signal I140 outputted from the I-DAC 120 is multiplied by a carrier wave Fc 160, and an analog modulated signal Q150 outputted from the Q-DAC 130 is multiplied by a carrier wave Fc 160 which is out of phase by 90° with the carrier wave Fc 160 for the analog modulated signal I140. Then, the analog modulated signal I140 and the analog modulated signal Q150 are combined in 170. Thus, a modulation output is obtained.

Referring again to FIG. 2, from received data 200, a quadrature demodulator 20 removes the carrier wave Fc 210 which is out of phase with each other by 90°, and inputs the resultant to a corresponding one of an I-ADC (ADC: analog-to-digital converter) 220 and a Q-ADC 230. An output from the I-ADC 220 and an output from the Q-ADC 230 are combined to obtain a demodulation output.

Although the following descriptions focus on the quadrature modulator of FIG. 1, the same mechanism of the technical concept of the embodiments according to the present invention can be applied to the quadrature demodulator of FIG. 2.

Figure 3:
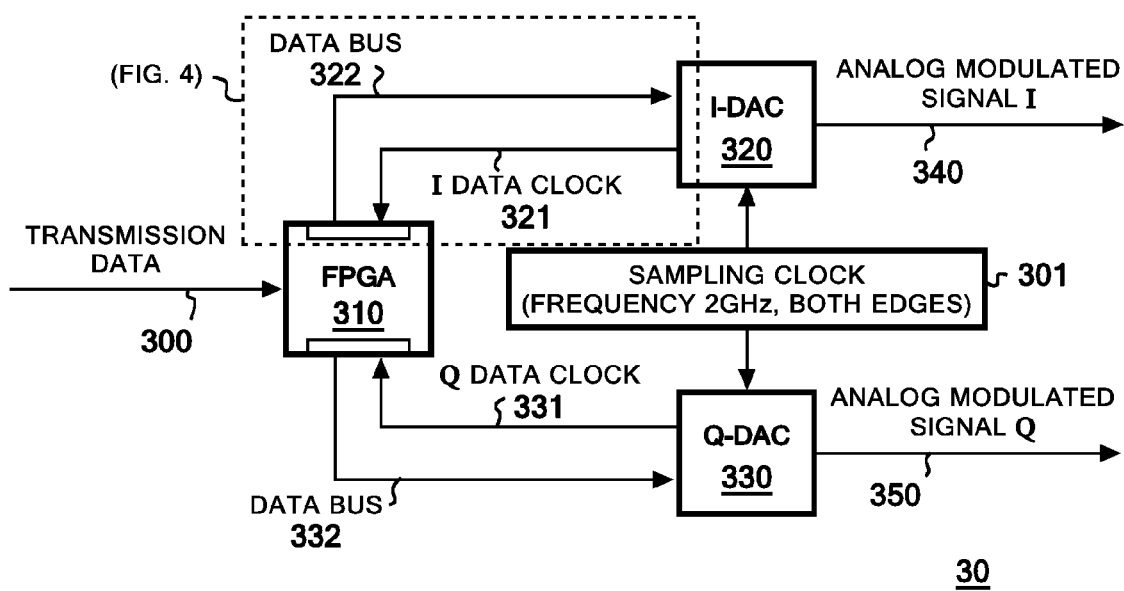
FIG. 3 is an overall view illustrating an example of implementing a quadrature converter using an FPGA.

FIG. 3 is an overall diagram illustrating an example of implementing a quadrature converter using a field programmable gate array (FPGA). The FPGA is a type of a gate array into which a user can program his or her own logical circuit. A relatively large-scaled programmable logic device, particularly one that is rewritable, is often called an FPGA. FIG. 3 corresponds to a portion 30 surrounded by a dotted line in FIG. 1. Transmission data 300 is inputted into an FPGA 310. The FPGA 310 and an I-DAC 320 are connected to each other through a data clock line 321 and a data bus line 322. The FPGA 310 and a Q-DAC 330 are connected to each other through a data clock line 331 and a data bus line 332.

An analog modulated signal I340 outputted from the I-DAC 320 and an analog modulated signal Q350 outputted from the Q-DAC 330 have to be in exact synchronization with each other. The FPGA 310 receives data clocks from the I-DAC 320 through the data clock line 321 and from the Q-DAC 330 through the data clock line 331, and uses the data clocks to synchronize data. The FPGA 310 then feeds the synchronized data to the I-DAC 320 through the data bus 322 and the Q-DAC 330 through the data bus 332.

Assume here that the analog modulated signal I340 outputted from the I-DAC 320 and the analog modulated signal Q350 outputted from the Q-DAC 330 are 256-level signals (expressible in multiple bits) and that the sampling rate is 4 Gsps (sampled using both rising and falling edges of a clock of 2 GHz-frequency). In this case, the data bus 322 and the data bus 332 require a data transfer rate of 8×4 G=32 Gbps. To accomplish such a high transfer rate, a parallel bus interleaved between the FPGA 310 and each of the I-DAC 320 and the Q-DAC 330 is used.

Figure 4:
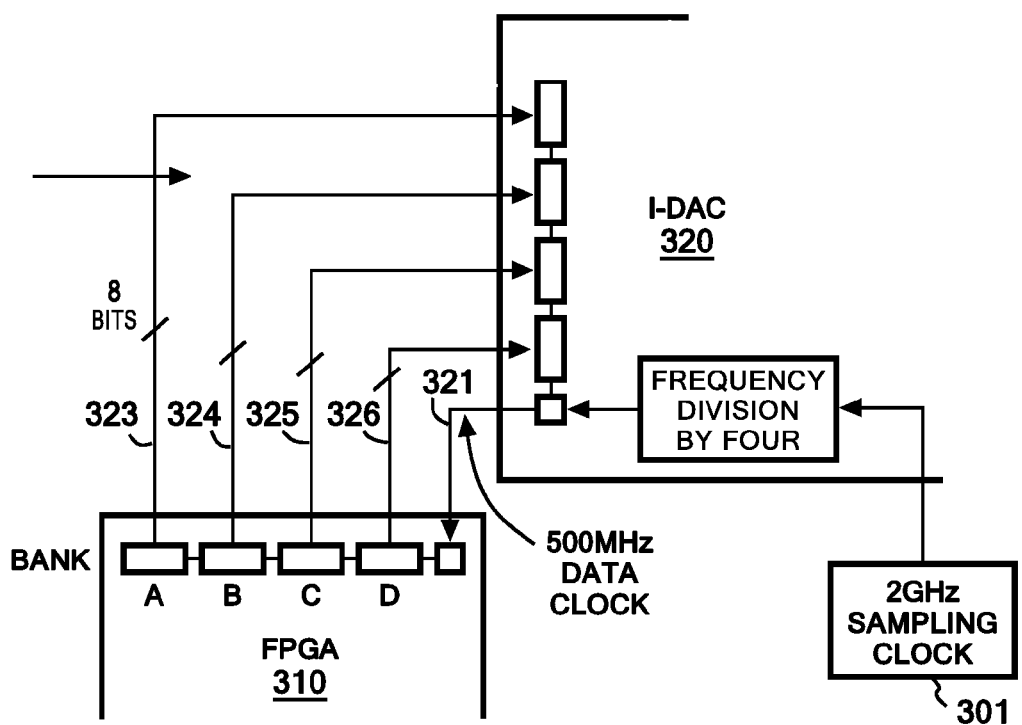
FIG. 4 is a diagram illustrating how the FPGA and an I-DAC are connected and showing, in detail, the portion surrounded by a dotted line in FIG. 3.

FIG. 4 is a diagram illustrating how the FPGA and the I-DAC are connected. Specifically, FIG. 4 shows in detail a portion surrounded by the dotted line in FIG. 3. The data bus is divided into four banks A, B, C, and D through each of which 8-bit data is transferred in synchronization with a 500-MHz clock (both edges). The I-DAC 320 divides an externally-supplied (or self-supplied), 2-GHz sampling clock 301 into four 500-MHz data clocks by using a frequency divider (prescaler). The FPGA 310 outputs data in synchronization with both edges of the 500-MHz data clocks. Since the data clocks are generated by dividing the sampling clock into four clocks, there is a problem of a possible phase shift between a data clock outputted from the I-DAC 320 and a data clock outputted from the Q-DAC 330 (FIG. 3).

Figure 5:
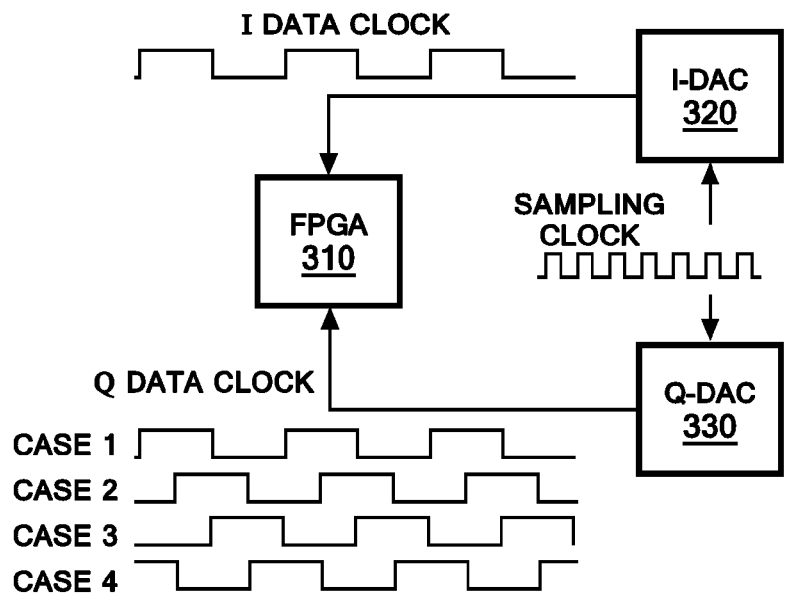
FIG. 5 is a schematic diagram showing possible four cases (Cases 1 to 4) of the phase of a Q-DAC data clock, based on a 2-GHz sampling clock and an I-DAC data clock.

FIG. 5 is a schematic diagram showing possible four cases (Cases 1 to 4) of phase of a Q-DAC data clock, based on a 2-GHz sampling clock and an I-DAC data clock. Case 1 is where the Q-DAC data clock is in phase with the I-DAC data clock. Case 2 is where the Q-DAC data clock is behind the I-DAC data clock by 90°. Case 3 is where the Q-DAC data clock is behind the I-DAC data clock by 180°. Case 4 is where the Q-DAC data clock is behind the I-DAC data clock by 270°. The I-DAC 320 and the Q-DAC 330 each performs frequency division independently. Accordingly, even if the I-DAC 320 and the Q-DAC 330 both generate a data clock based on a sampling clock, the four different patterns described above are possible, depending on the timing that each of the I-DAC 320 and the Q-DAC 330 uses for the frequency division.

Figure 6:
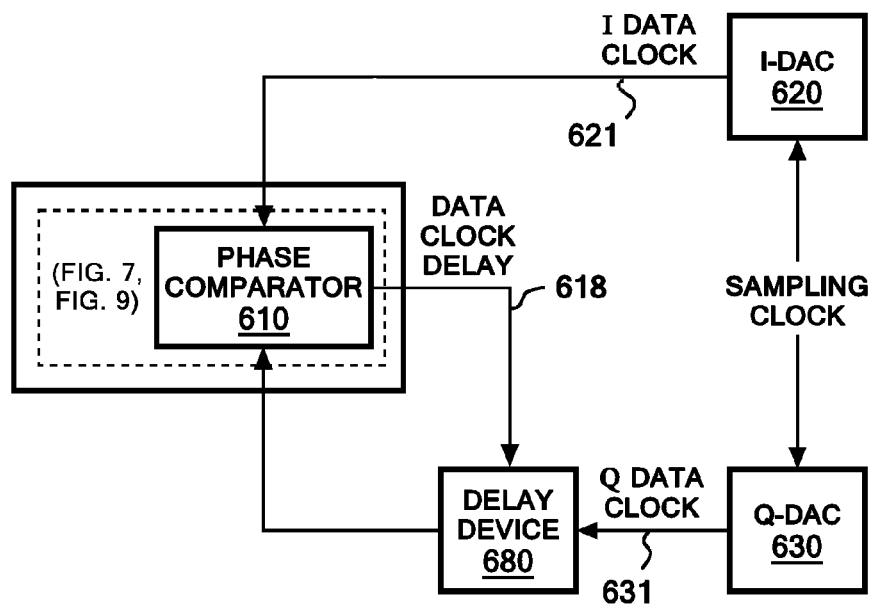
FIG. 6 is a diagram showing an overall configuration of the device according to an embodiment of the present invention.

FIG. 6 is a diagram showing an overall configuration of the device according to an embodiment the present invention. In the embodiment of the present invention, phase comparison is conducted upon receipt of an I data clock 621 outputted from an I-DAC 620 and a Q data clock 631 outputted from a Q-DAC 630. Further, a phase comparator (PFD: Phase Frequency Detector) 610 having a function of outputting a data clock delay signal (data clock DELAY) is provided.

In the embodiment of the present invention, for phase alignment of the I data clock 621 and the Q data clock 631, the I data clock 621 and the Q data clock 631 are compared to each other using an XOR (exclusive OR), and the result is sampled using a "phase sampling clock" asynchronous with the data clocks. Then, the number of events where the sampled value is 0 and the number of events where the sampled value is 1 are separately counted. Using these count values, the phase shift between the data clocks is determined.

Further, a delay device 680 with a data clock delay function is provided in the DAC (or in the FPGA) to distinguish between the 90° out-of-phase case (Case 2) and the 270° out-of-phase case (Case 4).

Figure 7:
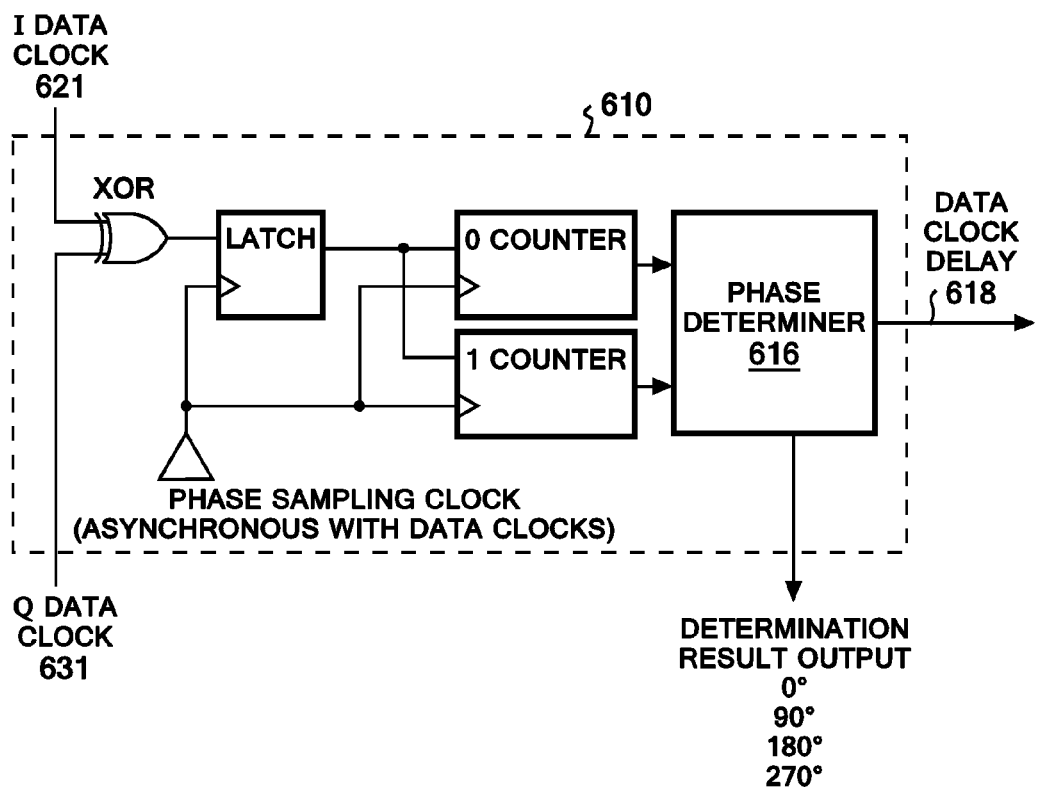
FIG. 7 is a diagram illustrating how the phase comparator is implemented according to a first embodiment of the present invention.

FIG. 7 is a diagram illustrating how the phase comparator is implemented according to a first embodiment. FIG. 7 corresponds to the portion surrounded by a dotted line in FIG. 6. A result of an XOR (exclusive OR) of the I data clock 621 and the Q data clock 631 is latched on a phase sampling clock. Any frequency may be used for the phase sampling clock as long as the phase sampling clock is asynchronous with the data clocks. Usually, the phase sampling clock has lower frequency than the data clock. However, as the frequency of the phase sampling clock becomes lower, the lesser the number of samples can be taken per unit time, and therefore longer measurement time is required. The phase sampling clock can be supplied by the phase comparator 610, or by an independent part. The expressions "asynchronous" and "asynchronous with the data clock" are important in the meaning of the technical concept of the embodiments of the present invention, and should be interpreted in a wide sense in such technical meaning.

Figure 8:
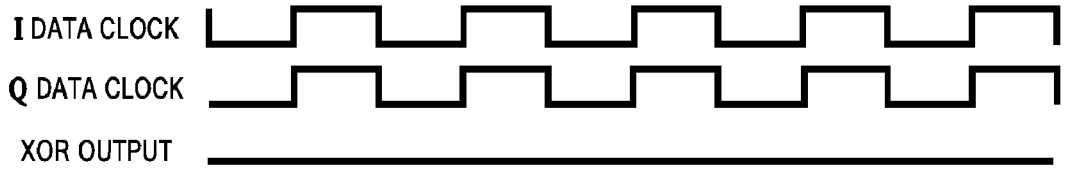
FIG. 8 is a diagram showing waveforms of an I data clock, a Q data clock, and an XOR based on the I and Q data clocks.
Figure 8:
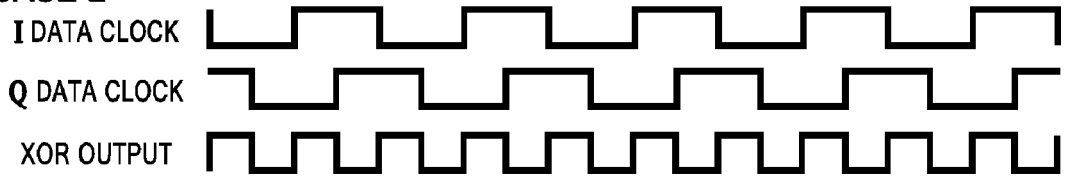
Figure 8:
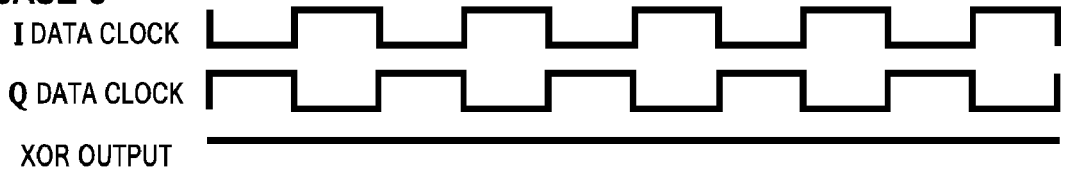
Figure 8:
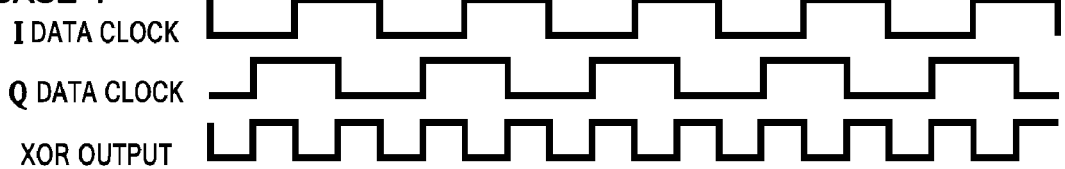

FIG. 8 is a diagram showing waveforms of an I data clock, a Q data clock, and an XOR based on the I and Q data clocks. A latch output is inputted to two counters shown in FIG. 7: a 0-counter and a 1-counter. Here, the 0-counter counts up only when the latch output is 0. Similarly, the 1-counter counts up only when the latch output is 1. After measurement for a certain period of time, a phase determiner 616 (FIG. 7) can determine a phase shift between the I data clock and the Q data clock by referring to the values of these two counters.

As FIG. 8 shows, in Cases 1 and 3, an XOR output is a fixed value of 0 and 1, respectively. On the other hand, in Cases 2 and 4, since the XOR output appears at a half cycle of each of the I data clock and the Q data clock, these appearances can be counted.

Relationships between the 0-counter value and the 1-counter value are shown below, and a phase shift can be easily determined as follows based on a comparison between the 0-counter value and the 1-counter value:

When 0-counter>>1-counter, a phase shift is about 0°.
When 0-counter<<1-counter, a phase shift is about 180°.
When 0-counter≈1-counter, a phase shift is about 90° or 270°.

This is merely an example of "phase determination criteria." Those skilled in the art can come up with various modes, and further, can make the phase determination based on flexibly-modified phase determination criteria, for example.

It is desirable that the I data clock 621 and the Q data clock 631 have the same delay time between being inputted to the phase comparator 610 and reaching an XOR. However, when there is a difference in the delay time, the determination criteria of the phase comparator 610 should be changed based on a result of static timing analysis and a data clock frequency.

Figure 9:
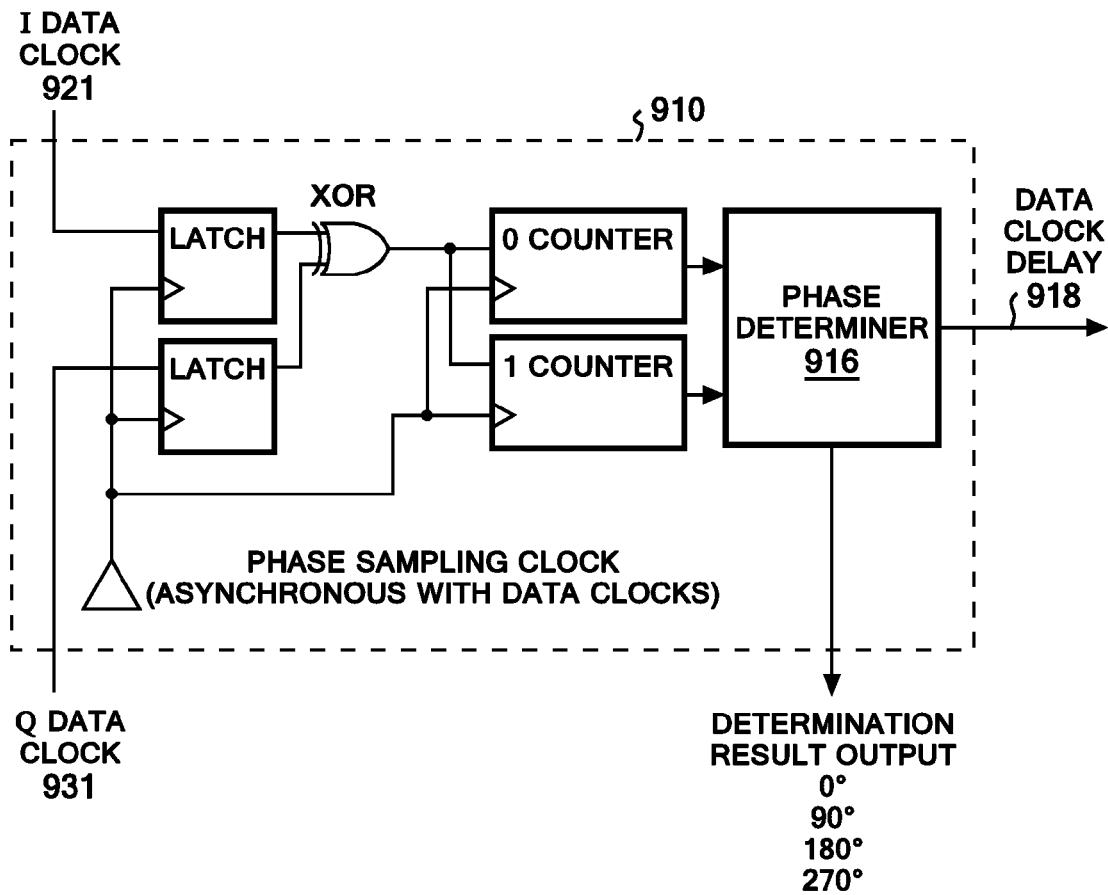
FIG. 9 is a diagram illustrating how the phase comparator is implemented according to a second embodiment of the present invention.

FIG. 9 is a diagram illustrating how the phase comparator is implemented according to a second embodiment of the present invention. FIG. 9 corresponds to the portion surrounded by the dotted line in FIG. 6. This implementation method is effective when the XOR operation rate is less than 1 GHz. This implementation method is effective if, as a latch, FPGA-owned, high-speed latch with I/O for SERDES can be used. It should be noted that the configuration of the latch, the configuration of an XOR, their positional relationship, their connection relationship, and their connection order are different from the configuration in FIG. 7.

Figure 10:
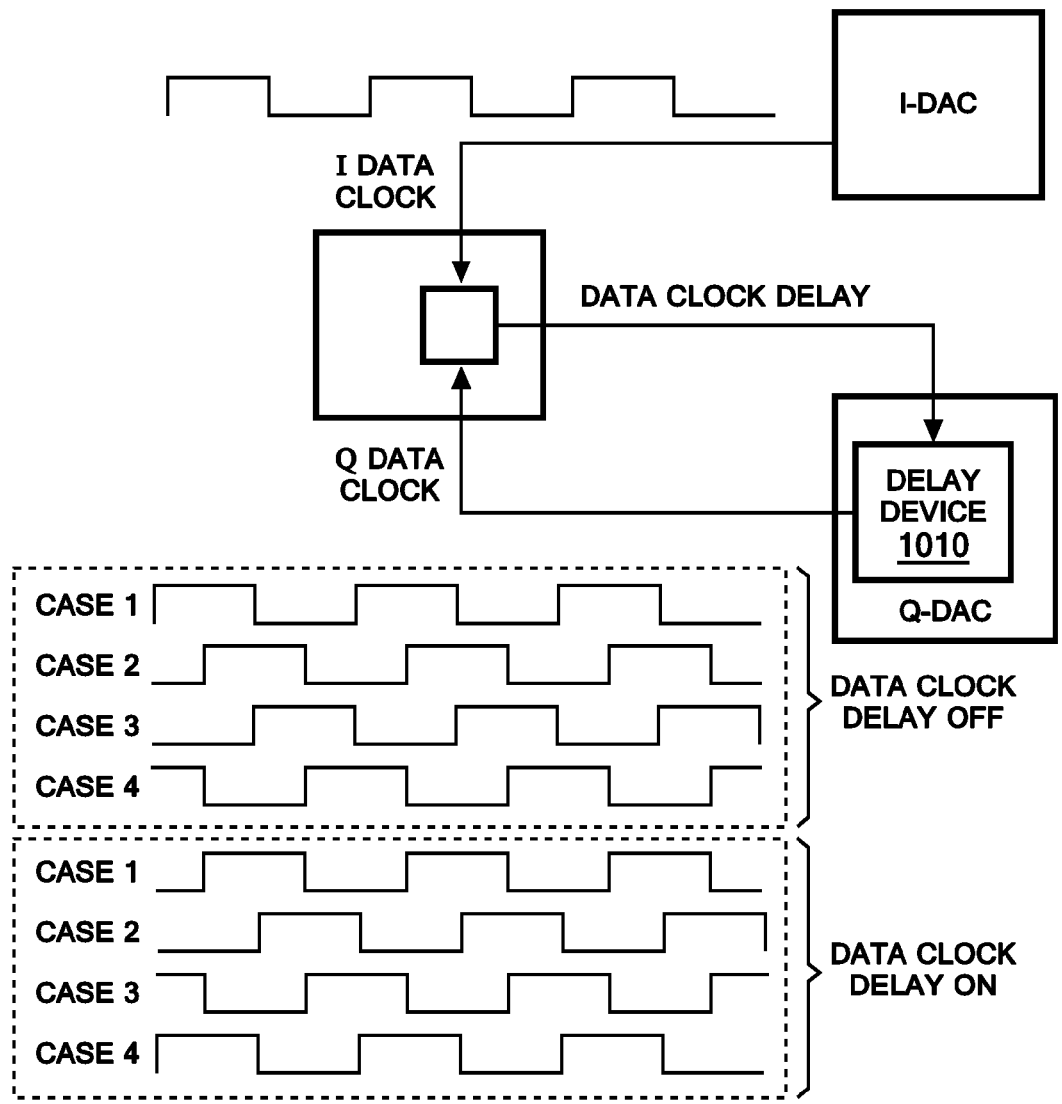
FIG. 10 is a diagram showing a configuration of the present invention employing a function of delaying data clock output of a DAC by 90°.

FIG. 10 is a diagram showing a configuration of an embodiment of the present invention employing a function of delaying data clock output of a DAC by 90°. The method shown here distinguishes between a 90° phase shift and a 270° phase shift by using a clock delay device 1010 of a Q-DAC. Input of a data clock DELAY signal 618 to the DAC causes the DAC to output a data clock with a 90° delay. Alternatively, the I-DAC may include the clock delay device 1010. Various ways may be thought of as to which of the I-DAC and the Q-DAC makes relative delay.

The relationship between the 0-counter value and the 1-counter value is shown below. Case 2 (90° phase shift) and Case 4 (270° phase shift) can be distinguished from each other by measuring a counter value obtained when the data clock DELAY is turned off and a counter value obtained when the data clock DELAY is turned on.

Case 2 (90° phase shift):
A phase shift is about 90° when:
0-counter $\approx$ 1-counter when the data clock DELAY is turned off, and
0-counter $\ll$ 1-counter when data clock DELAY is turned on.

Case 4 (270° phase shift):
A phase shift is about 270° when:
0-counter $\approx$ 1-counter when the data clock DELAY is turned off, and
0 $\gg$ 1-counter when data clock DELAY is turned on.

The count values may be stored in a memory if needed.

Figure 11:
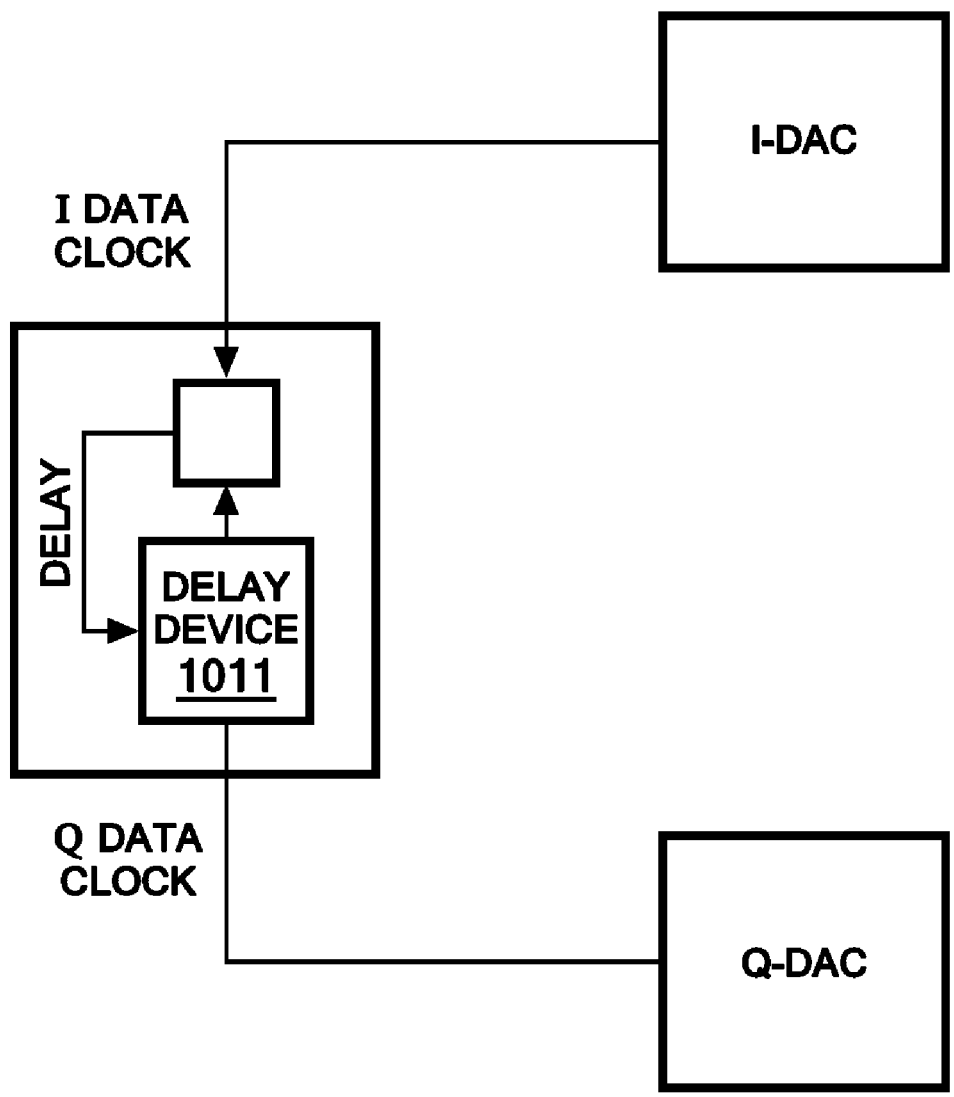
FIG. 11 is a diagram showing a configuration employing a delay device of the FPGA according to embodiments of the present invention.

FIG. 11 is a diagram showing a configuration of an embodiment of the present invention employing a delay device of the FPGA. A delay device or a delay circuit (IODELAY) equipped in Xilinx Virtex-5 can cause a delay of 64 steps per 75 psec (75×0 psec to 75×63 psec). Assuming that the data clock is 500 MHz, six or seven steps of delay is needed for ¼ phase shift.

As will be appreciated by one skilled in the art, aspects of the present invention may be embodied as a system, device or method (as described above) or as a computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

A combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or a suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or a suitable combination of the foregoing. In the context of this document, a computer readable storage medium may be a tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take a of a variety of forms, including, but not limited to, electro-magnetic, optical, or a suitable combination thereof. A computer readable signal medium may be a computer readable medium that is not a computer readable storage medium and that can communicate, propagate, or transport a program for use by or in connection with an instruction execution system, apparatus, or device.

Program code embodied on a computer readable medium may be transmitted using a appropriate medium, including but not limited to wireless, wireline, optical fiber cable, RF, etc., or a suitable combination of the foregoing.

Computer program code for carrying out operations for aspects of the present invention may be written in a combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

What is claimed is:

1. A computer-implemented method for detecting a phase shift between an I data clock and a Q data clock in processing an I data signal or a Q data signal used in quadrature modulation or quadrature demodulation, wherein said I data clock and said Q data clock are obtained based on a sampling clock, and said method comprising:

receiving an input of said I data clock and said Q data clock;
performing exclusive-ORing (XORing) on said I data clock and said Q data clock;
latching a result of the performance of XORing on a phase sampling clock which is asynchronous with said I data clock and said Q data clock to create a sampled result;
incrementing a first number when said sampled result having a value of 0 occurs in a predetermined period of time;
incrementing a second number when said sampled result having a value of 1 occurs in said predetermined period of time;
comparing said incremented first number and incremented second number and determining, based on a phase determination criterion, a phase shift between said I data clock and said Q data clock;
detecting a phase shift between said I data clock and said Q data clock according to said determination based on said phase determination criterion;
delaying said I data clock or said Q data clock;
incrementing said first number and said second number if said step of delaying said I data clock or Q data clock is executed or incrementing a third number when said sampled result of 0 occurs and incrementing a fourth number when said result of 1 occurs, if said step of delaying said I data clock or said Q data clock is not executed; and
determining a phase shift by comparing said first number, said second number, said third number, and said fourth number and distinguishing between a case where said I data clock and said Q data clock are out of phase with each other by 90° and a case where said I data clock and said Q data clock are out of phase with each other by 270°.

2. The method according to claim 1, wherein said phase sampling clock is generated by dividing a frequency of a sampling clock (prescaling) based on which said I data clock and said Q data clock are generated.

3. The method according to claim 1, further comprising: changing said phase determination criterion.

4. The method according to claim 1, further comprising:
obtaining an analog modulated signal I by inputting said I data clock to an I digital-to-analog converter (DAC);
obtaining an analog modulated signal Q by inputting said Q data clock to a Q digital-to-analog converter (DAC);
multiplying said analog modulated signal I by a fist carrier wave; and
multiplying said analog modulated signal Q by a second carrier wave that is out of phase by 90° with said first carrier wave by which said analog modulated signal I is multiplied.

5. A computer-implemented device for comparing phases of an I data clock and a Q data clock in processing an I data signal or a Q data signal used in quadrature modulation or quadrature demodulation, wherein said I data clock and said Q data clock are obtained based on a sampling clock, and said device comprising:

an XOR circuit that (i) receives an input of said I data clock and said Q data clock and (ii) performs exclusive-ORing (XORing) on said I data clock and said Q data clock;
a latch circuit that latches a result of the performance of XORing on a phase sampling clock which is asynchronous with said I data clock and said Q data clock to create a sampled result, wherein said latch circuit is connected to said XOR circuit;
a first counter circuit that increments a first number when said sampled result having a value of 0 occurs in a predetermined period of time, wherein said first counter circuit is connected to said latch circuit;
a second counter circuit that increments a second number when said sampled result having a value of 1 occurs in said predetermined period of time, wherein said second counter circuit is connected to said latch circuit;
a phase determiner that compares said incremented first number and said incremented second number to determine, based on a phase determination criterion, a phase shift between said I data clock and said Q data clock, wherein said phase determiner is connected to said first counter circuit and said second counter circuit; and
a delay device that switches on and off a data clock delay depending on said phase determination made by said phase determiner,
wherein (i) said first counter circuit further increments said first number and said second counter circuit further increments said second number if said I data clock or said Q data clock is delayed or (ii) said first counter circuit further increments a third number when said sampled result of 0 occurs and said second counter circuit further increments a fourth number when said result of 1 occurs, if said I data clock or said Q data clock is not delayed, and
wherein the phase determiner further compares said first number, said second number, said third number, and said forth number and distinguishes between a case where said I data clock and said Q data clock are out of phase with each other by 90° and a case where said I data clock and said Q data clock are out of phase with each other by 270°.

6. A computer-implemented device for comparing phases of an I data clock and a Q data clock in processing an I data signal or a Q data signal used in quadrature modulation or quadrature demodulation, wherein said I data clock and said Q data clock are obtained based on a sampling clock, and said device comprising:

a plurality of latch circuits that (i) receive an input of said I data clock and said Q data clock and (ii) perform latching on a phase sampling clock which is asynchronous with said I data clock and said Q data clock;
an XOR circuit that performs exclusive-ORing (XORing) on said I data clock and the Q data clock to create a sampled result, wherein said XOR circuit is connected to said plurality of latch circuits;
a first counter circuit that increments a first number when said sampled result having a value of 0 occurs in a predetermined period of time, wherein said first counter circuit is connected to said XOR circuit;
a second counter circuit that increments a second number when said sampled result having a value of 1 occurs in said predetermined period of time, wherein said second counter circuit is connected to said XOR circuit;
a phase determiner that compares said incremented first number and said incremented second number to determine, based on a phase determination criterion, a phase shift between said I data clock and said Q data clock, wherein said phase determiner is connected to said first counter circuit and said second counter circuit;
a delay device switches on and off a data clock delay depending on said phase determination made by phase determiner, wherein (i) said first counter circuit further increments said first number and said second counter circuit further increments said second number if said I data clock or said Q data clock is delayed or (ii) said first counter circuit further increments a third number when said sampled result of 0 occurs and said second counter circuit further increments a fourth number when said result of 1 occurs, if said I data clock or said Q data clock is not delayed, and wherein the phase determiner further compares said first number, said second number, said third number, and said forth number and distinguishes between a case where said I data clock and said Q data clock are out of phase with each other by 90° and a case where said I data clock and said Q data clock are out of phase with each other by 270°.

* * * * *